(12) United States Patent
Sharma

(10) Patent No.: US 9,787,286 B2
(45) Date of Patent: Oct. 10, 2017

(54) LOW PHASE SHIFT, HIGH FREQUENCY ATTENUATOR

(71) Applicant: Peregrine Semiconductor Corporation, San Diego, CA (US)

(72) Inventor: Vikas Sharma, Reading (GB)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/382,435

(22) Filed: Dec. 16, 2016

(65) Prior Publication Data

US 2017/0237412 A1    Aug. 17, 2017

Related U.S. Application Data

(63) Continuation of application No. 14/958,809, filed on Dec. 3, 2015, now Pat. No. 9,602,091.

(51) Int. Cl.
  *H03L 5/00*     (2006.01)
  *H03H 11/24*    (2006.01)
  *H03H 11/28*    (2006.01)

(52) U.S. Cl.
  CPC ........... *H03H 11/245* (2013.01); *H03H 11/28* (2013.01)

(58) Field of Classification Search
  None
  See application file for complete search history.

(56) References Cited

U.S. PATENT DOCUMENTS 3,493,875 A * 2/1970 Stuckert ............... G01R 13/342
                                                 327/308
4,378,536 A * 3/1983 Schwarzmann ....... H03H 7/255
                                                 327/308
4,754,229 A * 6/1988 Kawakami ............. H03F 3/601
                                                 330/277

(Continued)

FOREIGN PATENT DOCUMENTS

EP      2387151      11/2011
WO      2017095519   6/2017

OTHER PUBLICATIONS

Almo, Khareem E., Notice of Allowance received from the USPTO dated Oct. 12, 2016 for U.S. Appl. No. 14/958,809, 14 pgs.

(Continued)

*Primary Examiner* — Lincoln Donovan
*Assistant Examiner* — Khareem E Almo
(74) *Attorney, Agent, or Firm* — Jaquez Land Greenhaus LLP; Martin J. Jaquez, Esq.; John Land, Esq.

(57) ABSTRACT

A wideband RF attenuator circuit that has a reduced impact on the phase of an applied signal when switched between an attenuation state and a non-attenuating reference or bypass state. A low phase shift attenuation at high RF frequencies can be achieved by utilizing a switched signal path attenuator topology with multiple distributed transmission line elements per signal path to provide broadband operation, distribute parasitic influences, and improve isolation to achieve higher attenuation at higher frequencies while still maintaining low phase shift operational characteristics. In an alternative embodiment, extension to even higher frequencies can be achieved by utilizing a quarter-wave transmission line element at the signal interfaces of each signal path, thereby improving insertion loss and power handling.

39 Claims, 5 Drawing Sheets

(56) References Cited

U.S. PATENT DOCUMENTS

| | | | |
|---|---|---|---|
| 4,978,932 A | 12/1990 | Gupta et al. | |
| 5,006,735 A * | 4/1991 | Taylor | H03H 11/245 327/308 |
| 5,274,339 A * | 12/1993 | Wideman | H03F 3/607 330/277 |
| 5,309,048 A * | 5/1994 | Khabbaz | H03H 11/245 327/306 |
| 5,440,280 A * | 8/1995 | Lord | H03H 11/245 327/308 |
| 5,448,771 A * | 9/1995 | Klomsdorf | H01P 5/187 333/116 |
| 5,530,922 A * | 6/1996 | Nagode | H03G 3/3042 330/129 |
| 5,625,894 A * | 4/1997 | Jou | H04B 1/52 333/103 |
| 5,629,655 A * | 5/1997 | Dent | H03C 1/542 333/172 |
| 5,847,624 A | 12/1998 | Pritchett | |
| 6,195,536 B1 * | 2/2001 | Peckham | H03F 1/56 333/32 |
| 6,472,948 B1 * | 10/2002 | Kyriakos | H01P 1/22 327/306 |
| 7,164,995 B2 * | 1/2007 | Pollock | G01R 1/06766 324/126 |
| 7,196,566 B2 * | 3/2007 | Kaiser, Jr. | H03H 11/245 327/308 |
| 7,449,977 B2 * | 11/2008 | Schoning | H04B 1/525 333/126 |
| 8,674,746 B1 * | 3/2014 | Staudinger | H03H 7/25 327/333 |
| 9,602,091 B1 | 3/2017 | Sharma | |
| 2004/0239437 A1 * | 12/2004 | Hosoya | H03F 3/605 333/22 R |
| 2005/0093606 A1 * | 5/2005 | Kaiser, Jr. | H03H 11/245 327/308 |
| 2007/0120619 A1 * | 5/2007 | Kearns | H01P 1/15 333/103 |
| 2009/0079489 A1 * | 3/2009 | Zhang | H03H 11/245 327/308 |
| 2009/0146724 A1 * | 6/2009 | Mun | H01P 1/15 327/383 |
| 2011/0140755 A1 * | 6/2011 | Hong | H03H 7/25 327/308 |
| 2012/0249186 A1 * | 10/2012 | Chen | H01L 28/10 327/100 |
| 2012/0262217 A1 * | 10/2012 | Gorbachov | H04B 1/48 327/382 |
| 2013/0021111 A1 * | 1/2013 | Grondahl | H01P 1/18 333/164 |
| 2013/0207739 A1 * | 8/2013 | Bakalski | H03H 7/40 333/33 |
| 2013/0222075 A1 * | 8/2013 | Reedy | H03J 3/20 333/32 |
| 2013/0257564 A1 * | 10/2013 | Huang | H01L 23/147 333/177 |
| 2014/0104132 A1 * | 4/2014 | Bakalski | H03H 7/38 343/861 |
| 2014/0167834 A1 * | 6/2014 | Stuber | H01L 27/1203 327/382 |
| 2015/0091776 A1 * | 4/2015 | Gaynor | H03K 17/693 343/860 |
| 2015/0235971 A1 * | 8/2015 | Smith | H01L 23/66 333/174 |
| 2015/0236671 A1 * | 8/2015 | Smith | H03H 7/01 327/553 |
| 2017/0141752 A1 * | 5/2017 | Hino | H03H 7/17 |

OTHER PUBLICATIONS

Mouanda, Thierry, International Search Report and Written Opinion received from the EPO dated Jan. 3, 2017 for appln. No. PCT/US2016/054929, 16 pgs.

Takasu, et al., "S-Band MMIC Digital Attenuator with Small Phase Variation", IEEE 1999, pp. 421-424.

Yeh, et al., "A Miniature DC-to-50 GHz CMOS SPDT Distributed Switch", 2005 European Microwave Conference CNIT LA Defense, Paris, France, Oct. 4-6 2005, pp. 1611-1614.

Eom, et al., "A 6-30 GHz Compact 3-bit Digital Attenuator MMIC using InP/InGaAs PIN Diodes", IEEE 2008, 4 pgs.

* cited by examiner

Reference State

Attenuation State

LOW PHASE SHIFT, HIGH FREQUENCY ATTENUATOR

CROSS-REFERENCE TO RELATED APPLICATION

This application is a continuation of, and claims the benefit of priority under 35 USC §120 of, commonly assigned and co-pending prior U.S. application Ser. No. 14/958,809, "Low Phase Shift, High Frequency Attenuator", filed Dec. 3, 2015, the contents of which are hereby incorporated by reference herein as if set forth in full.

BACKGROUND (1) Technical Field

This invention relates to electronic circuits, and more particularly to radio frequency attenuator circuits.

(2) Background

An attenuator is an electronic device that reduces the power of a signal without appreciably idstorting its waveform, and is widely used in electronic circuits, particularly in radio frequency (RF) circuits. An attenuator is functionally the opposite of an amplifier (although the two work by different methods)—while an amplifier provides gain, an attenuator provides loss (or, equivalently, a gain less than one). Classic examples of RF attenuators are bridged-T type, pi-type, T-type, and L-pad type attenuators.

An ideal RF attenuator would not affect the phase of an applied signal when switched into an attenuation state or into a non-attenuating reference state (also known as a bypass state). However, in actual circuit embodiments, conventional attenuators have a different phase characteristic in their attenuation and reference states. As the frequency of an RF signal applied to a conventional attenuator increases, the amount of phase shift also increases. This characteristic can be problematic if a constant phase shift is desired from the attenuator (for example, in a phase array antenna).

FIG. 1a is a schematic diagram of one embodiment of a conventional switchable pi-type RF attenuator 100. In the reference state, an RF signal applied to an In port passes to an Out port through a closed switch M0 (shown implemented as a field effect transistor, or FET), while open shunt switches M1 and M2 nominally isolate respective resistors R1 and R2 from circuit ground. In the attenuation state, switch M0 is open and an RF signal applied to the In port passes to the Out port through a resistor R0, while closed shunt switches M1 and M2 connect respective resistors R1 and R2 to circuit ground. (Since the circuit is generally symmetrical, either port can be "In" or "Out", hence the labelling is arbitrary in this example).

While widely used in RF circuits for switching, a FET is not an ideal switch having zero impedance when closed and infinite impedance when open. However, the resistance of a closed FET, $R_{ON}$, is often negligible and thus can be modeled as a simple conductor in many applications. Such is not the case for an open FET, which presents as a capacitance $C_{OFF}$ that generally cannot be ignored at RF frequencies, particularly at high RF frequencies (e.g., above about 10 GHz).

FIG. 1b is a diagram of a circuit model of the pi-type RF attenuator 100 of FIG. 1a in a reference state, with switch M0 closed and switches M1 and M2 open. A closed FET switch is modeled as a simple conductor and an open FET switch is modeled as a capacitor. The attenuator essentially becomes a low pass filter, and will induce a phase lag in any applied RF signal.

FIG. 1c is a diagram of a circuit model of the pi-type RF attenuator 100 of FIG. 1a in an attenuation state, with switch M0 open and switches M1 and M2 closed. Again, a closed FET switch is modeled as a simple conductor and an open FET switch is modeled as a capacitor. The attenuator essentially becomes a high pass filter, and will induce a phase lead in any applied RF signal.

FIG. 2 is a graph 200 showing an approximation of phase as a function of frequency for the reference state 202 and the attenuation state 204 of the pi-type RF attenuator 100 of FIG. 1a when an RF signal is applied. As is clear from the graph 200, switching from the reference state 202 to the attenuation state 204 causes a significant shift in the phase of the applied RF signal. A further complication is that, at high RF frequencies, ground inductance (not shown in the models of FIG. 1b or FIG. 1c) and the $C_{OFF}$ of the M0 FET switch work to reduce the amount of attenuation that the circuit is designed to provide.

Referring again to the pi-type RF attenuator 100 of FIG. 1a, optional capacitors (not shown) can be added between the reference voltage (circuit ground in this example) and the In and Out ports to help reduce attenuation and phase changes as a function of frequency; however, doing so only works for a narrow bandwidth.

Accordingly, there is a need for a wideband RF attenuator circuit that has a reduced impact on the phase of an applied signal when switched between an attenuation state and a non-attenuating reference state. The present invention meets this need.

SUMMARY OF THE INVENTION

The invention encompasses a wideband RF attenuator circuit that has a reduced impact on the phase of an applied signal when switched between an attenuation state and a non-attenuating reference or bypass state. In particular, a low phase shift attenuation at high RF frequencies can be achieved by utilizing a switched signal path attenuator topology with multiple distributed transmission line elements per signal path to provide broadband operation, distribute parasitic influences, and improve isolation to achieve higher attenuation at higher frequencies while still maintaining low phase shift operational characteristics.

In an alternative embodiment, extension to even higher frequencies can be achieved by utilizing a quarter-wave transmission line element at the signal interfaces of each signal path, thereby improving insertion loss and power handling.

In both embodiments, an RF attenuator circuit includes multiple signal paths comprising a Bypass Path and one or more Attenuation Paths, any one of which may be selectively coupled to an In port and an Out port. The Bypass Path and each Attenuation Path are formed from a plurality of distributed transmission line elements, each of which has an associated shunt switch for selectively coupling the associated transmission line element to a reference voltage (e.g., circuit ground). In a first embodiment, state switches in each signal path control coupling of a one or more signal paths to the In and Out ports. In the alternative embodiment, quarter-wave transmission line elements at the signal interfaces of each signal path control which of the signal paths are coupled to the In and Out ports.

The details of one or more embodiments of the invention are set forth in the accompanying drawings and the descrip-

DESCRIPTION OF THE DRAWINGS

Like reference numbers and designations in the various drawings indicate like elements.

DETAILED DESCRIPTION OF THE INVENTION

The invention encompasses a wideband RF attenuator circuit that has a reduced impact on the phase of an applied signal when switched between an attenuation state and a non-attenuating reference or bypass state. In particular, a low phase shift attenuation at high RF frequencies can be achieved by utilizing a switched signal path attenuator topology with multiple distributed transmission line elements per signal path to provide broadband operation, distribute parasitic influences, and improve isolation to achieve higher attenuation at higher frequencies while still maintaining low phase shift operational characteristics.

In an alternative embodiment, extension to even higher frequencies can be achieved by utilizing a quarter-wave transmission line element at the signal interfaces of each signal path, thereby improving insertion loss and power handling.

State Switch Transmission Line Embodiment

Figure 3:
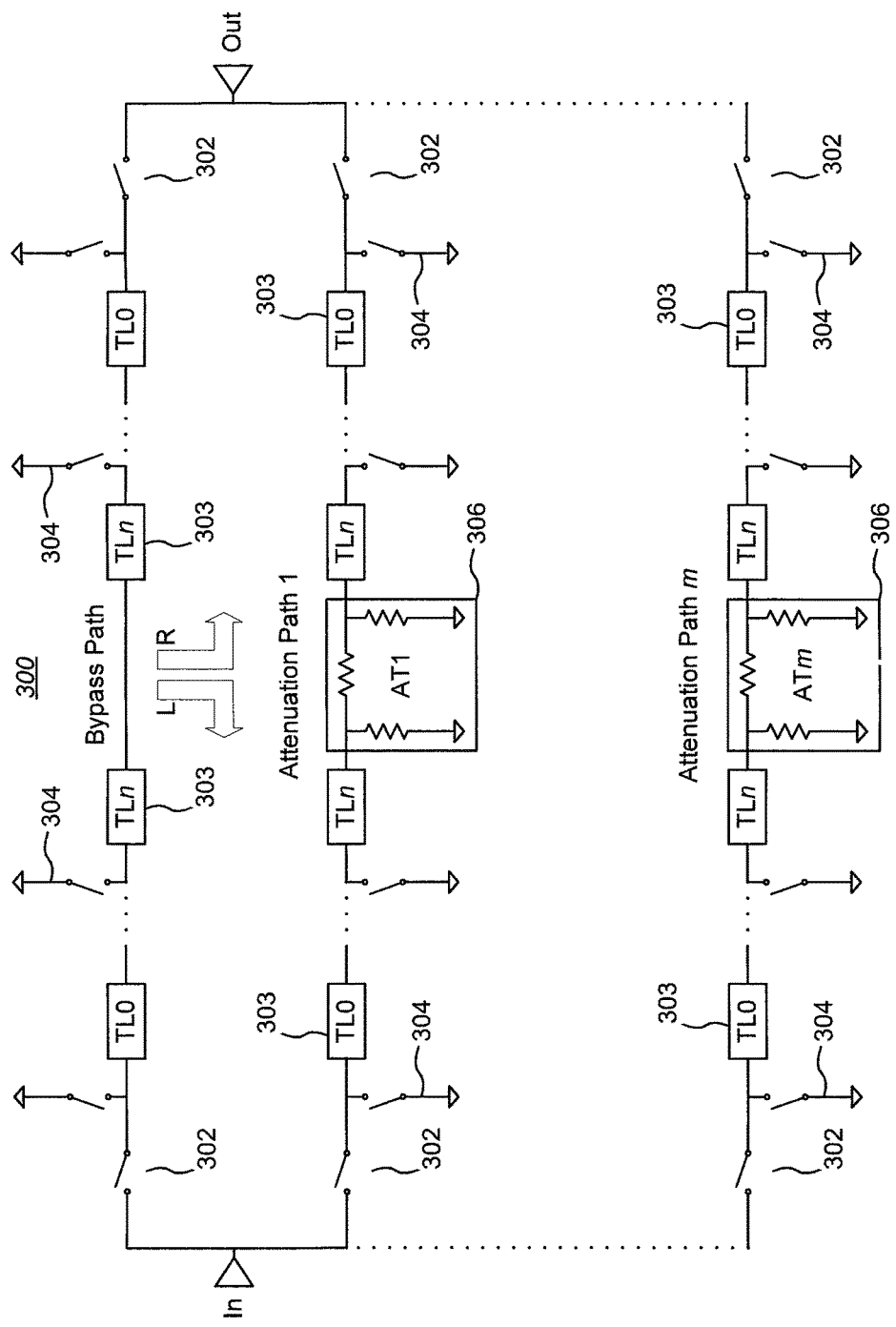
FIG. 3 is a schematic diagram of one embodiment of an RF attenuator circuit in accordance with the present invention.

FIG. 3 is a schematic diagram of one embodiment of an RF attenuator circuit 300 in accordance with the present invention. The RF attenuator circuit 300 includes a Bypass Path and one or more Attenuation Paths 1-$m$. The Bypass Path and each Attenuation Path 1-$m$ may be selectively coupled to a common In port and a common Out port through corresponding state switches 302, controlled by switching signals from external circuitry (not shown). Since the attenuator circuit 300 is generally symmetrical, either port can be "In" or "Out", hence the labelling is arbitrary in this example.

The RF attenuator circuit 300 and the external circuitry may be fabricated on the same integrated circuit (IC) die, or the switching signals may be provided externally from such an IC in known fashion. The switching signals select a reference or bypass state by only coupling the Bypass Path to the In and Out ports while decoupling the Attenuation Paths 1-$m$ from the In and Out ports. The switching signals select an attenuation state by coupling one or more Attenuation Paths 1-$m$ to the In and Out ports while decoupling the Bypass Path from the In and Out ports.

The Bypass Path and each Attenuation Path 1-$m$ are formed from a plurality of distributed transmission line elements TLx 303, each of which has an associated shunt switch 304 for selectively coupling the associated transmission line element TLx 303 to a reference voltage (usually circuit ground, as illustrated in FIG. 3 by way of example); for clarity, not all shunt switches 304 and transmission line elements 303 are labeled.

Each transmission line element TLx 303 can be modeled as an inductive tuning component configured to tune out the OFF capacitance $C_{OFF}$ of its associated shunt switch 304, and may be implemented, for example, as microstrips or coplanar waveguides. However, any suitable structure having transmission line characteristics at the frequency band of interest may be used, including simple inductors. However, it is particularly useful to use coplanar waveguides for ease of manufacturing for fabrication in complementary metal-oxide-semiconductor (CMOS) ICs with a silicon-on-insulator (SOI) process.

Each Attenuation Path 1-$m$ also includes a corresponding attenuator element AT1-ATm 306 which, in the embodiment of FIG. 3, is shown schematically as a conventional non-switchable pi-type attenuator (i.e., bypass circuitry and corresponding switch elements are omitted as unnecessary). Other attenuator circuits may be used as needed for particular applications, such as bridged-T type, T-type, and L-pad type attenuators (noting that an L-pad type attenuator would make the overall RF attenuator circuit 300 asymmetrical, which may be suitable when attempting to match different impedances on the In and Out ports).

Referring to FIG. 3, the transmission line elements TLx 303 of the Bypass Path are shown grouped into n left side L transmission line elements TL0-TLn and n right side R transmission line elements TL0-TLn; the transmission line elements TLx 303 of the Attenuation Paths 1-$m$ are similarly grouped (but not labeled L or R). For at least symmetrical type single attenuators, each attenuator element AT1-ATm 306 should normally be centrally located among the transmission line elements TLx 303 of the corresponding Attenuation Path 1-$m$; that is, between the left L and right R groups of transmission line elements TL0-TLn. In general, each of the left L and right R groups of transmission line elements TL0-TLn of the Bypass Path and the Attenuation Paths 1-$m$ should include a plurality of distributed transmission line elements TLx 303.

The amount of attenuation provided by each attenuator element 306 may be the same or different. For example, two Attenuation Paths may provide an attenuation of 16 dB and 8 dB respectively. It may be noted that if both of these example attenuator elements 306 are switched into circuit, the parallel attenuator elements 306 will provide an intermediate level of attenuation. This is so because, if matched correctly, any power (e.g., 0 dBm) applied to the In port will be split equally (e.g., −3 dBm) between the two signal paths (i.e., the 16 dB and the 8dB Attenuation Paths). The 16 dB Attenuation Path will significantly weaken the applied signal (by about −19 dBm) and thus not provide a significant amount of the power to the Out port; most of the power (about −11 dBm) will come through the 8 dB Attenuation Path. Overall, the total attenuation will be about 11 dB.

The attenuator elements 306 of parallel Attenuation Paths need not all be of the same type; for example, the attenuator element 306 in a first Attenuation Path may be a pi-type, while the attenuator element 306 in a second Attenuation Path may be a T-type or a Bridged-T type.

In operation, a particular signal path (Bypass Path or Attenuation Path) may be coupled to the In and Out ports by closing the state switches 302 corresponding to that path, and opening all of the corresponding shunt switches 304; concurrently, all non-selected paths are decoupled from the In and Out ports by opening the state switches 302 corresponding to those paths and closing all of the corresponding shunt switches 304, thereby isolating each transmission line element TLx of those not-selected paths. A signal applied to the In port will thus be conducted through the selected path to the Out port. If the selected signal path is an Attenuation Path, the applied signal will be attenuated by an amount determined by the corresponding attenuator element 306 of that path.

When implementing an RF attenuator circuit 300 embodiment in accordance with the concepts described above, it is generally important to maintain good return loss in intermediate stages of the transmission line paths. Matching conditions at different stages should be optimized to minimize the reflection at input/output and intermediary nodes. In particular, a desired goal is for the reflection coefficient, Gamma, to be essentially zero at both of the In and Out ports. Accordingly, while each of the illustrated Attenuation Paths 1-m and the Bypass Path have similarly labeled transmission line elements TLx, the tuning characteristics of such transmission line elements may vary from path to path. For RF switching devices, the transmission line elements TLx would typically be tuned to have a nominal impedance of 50 ohms by convention when using a symmetrical type of attenuator element 306 (e.g., bridged-T type, T-type, and pi-type attenuators).

In the case of multiple Attenuation Paths as shown in FIG. 3, when concurrently connecting two or more Attenuation Paths in parallel, the impedance of the RF attenuator circuit 300 is lowered, and accordingly the connecting input/output impedance would have to be lowered as well to avoid causing any signal reflection. Approaching the problem from the other end, the individual attenuator elements 306 can be designed for a higher impedance (100 Ohms, for example), so that when combined together in parallel, the total impedance matches the original input/output (e.g., 50 Ohm) impedance. For a distributed topology, such matching requirements mean that not only may changes be required for the main attenuator elements 306, but there may also be a need to raise or lower the impedances of one or more distributed transmission line elements TLx 303.

A notable aspect of the illustrated RF attenuator circuit 300 is that the Bypass presents essentially the same impedance characteristics to an applied RF signal as each Attenuation Path, and thus the phase shift difference between the reference/bypass and attenuation states is minimal. Utilizing a switched signal path attenuator topology with multiple distributed transmission line elements per signal path provides broadband operation.

A particularly useful aspect of using distributed transmission line elements TLx is that the elements may be physically separated when laid out on an IC die, which distributes parasitic influences and improves isolation, thereby allowing achievement of high attenuation at high frequencies while still maintaining low phase shift operational characteristics.

Quarter-Wave Transmission Line Embodiment

Figure 4:
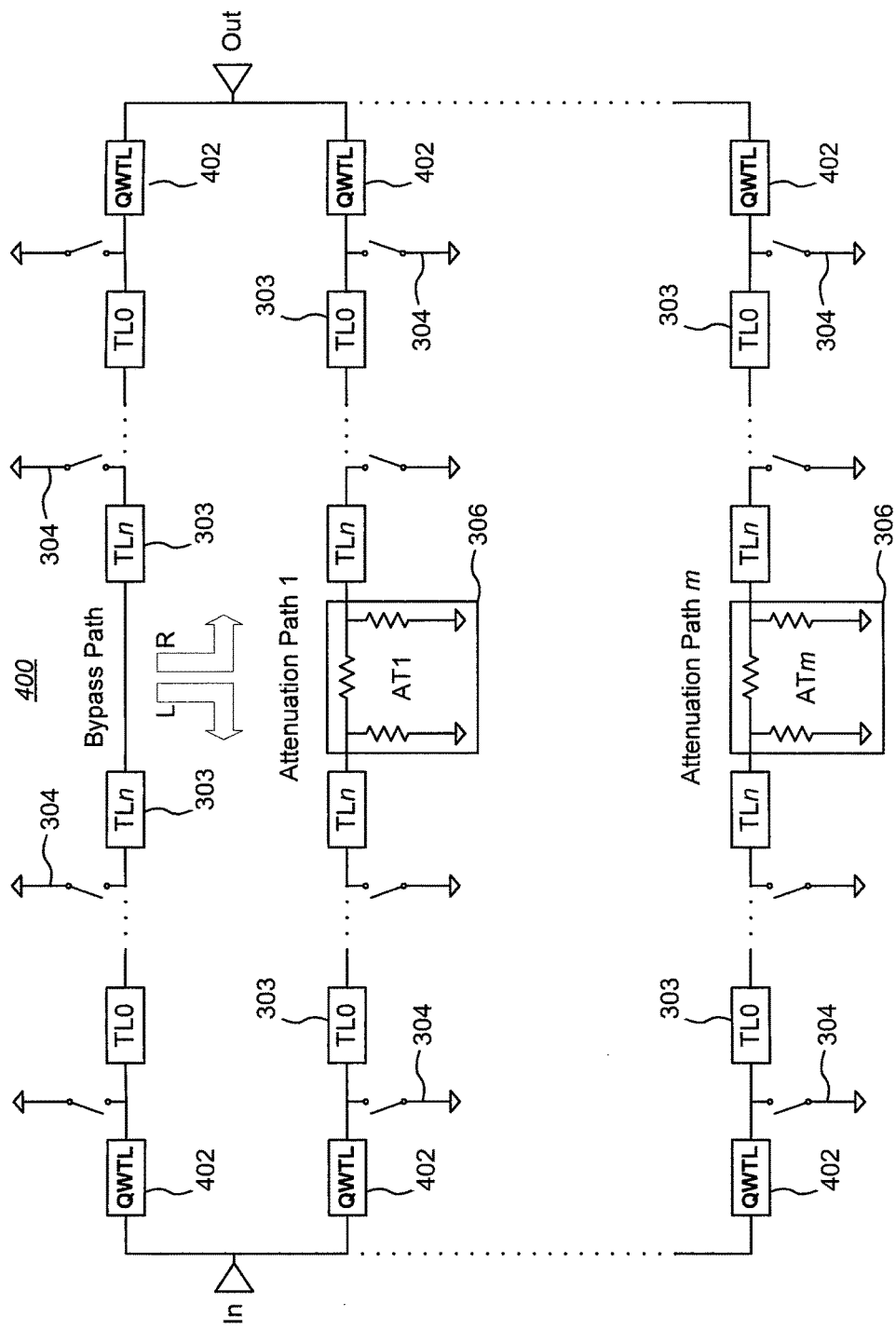
FIG. 4 is a schematic diagram of an alternative embodiment of an RF attenuator circuit in accordance with the present invention.

FIG. 4 is a schematic diagram of an alternative embodiment of an RF attenuator circuit 400 in accordance with the present invention. The RF attenuator circuit 400 is very similar to the RF attenuator circuit 300 shown in FIG. 3; however, a quarter-wave transmission line QWTL element 402 has been inserted at the In port and Out port signal interfaces of each signal path (Bypass Path and one or more Attenuation Paths) in place of the serial state switches 302.

A known characteristic of QWTL elements is that creating an open circuit in one signal path reflects all applied signal energy to a signal path that is not in the same open circuit state, and vice versa. Thus, taking the simplest case as an example, in an RF attenuator circuit 400 having only a Bypass Path and one Attenuation Path, closing the shunt switches 304 of the Bypass Path (thus shunting each of the transmission line elements TLx and the QWTL element of that path to ground, thereby creating an open circuit (at a selected center frequency) and opening the shunt switches of the Attenuation Path will cause—without need of intervening serial state switches 302, as in the RF attenuator circuit 300 shown in FIG. 3—an applied input signal to propagate through the Attenuation Path. Conversely, closing the shunt switches 304 of the Attenuation Path (thus shunting each of the transmission line elements TLx and the QWTL element of that path to ground, thereby creating an open circuit) and opening the shunt switches of the Bypass Path will—again without need of intervening serial state switches 302, as in the RF attenuator circuit 300 shown in FIG. 3—cause an applied input signal to propagate through the By-pass Path. Thus, the QWTL elements 402 effectively function as "virtual switches" without the impact on insertion loss that would be caused by physical serial state switches 302.

While each of the left L and right R groups of transmission line elements TL0-TLn of the Bypass Path and the Attenuation Paths 1-m may include a plurality of distributed transmission line elements TLx 303, each such left L and right R group may include only a QWTL element 402 and a single transmission line element TLx.

There are some significant advantages to using a QWTL-based RF attenuator circuit, including: (1) very low insertion loss; although some broadband operation is sacrificed, operation in a desired frequency band will have very low loss due to the absence of any series state switches 302; and (2) since the series state switches 302 are absent and the shunt switches 304 only need to withstand applied voltage (not current), the power handling characteristics of the attenuator circuit 400 are limited only by the power handling characteristics of the attenuator element 306 of a selected signal path.

As with the RF attenuator circuit 300 of FIG. 3, when implementing an RF attenuator circuit 400 embodiment in accordance with the concepts described above, it is generally important to maintain good return loss in intermediate stages of the transmission line paths. Matching conditions at different stages should be optimized to minimize the reflection at input/output and intermediary nodes. The discussion above regarding multiple parallel Attenuation Paths apply as well to embodiments of the type shown in FIG. 4, with the added note that the impedances of the quarter-wave transmission line QWTL elements 402 may need to be adjusted when combining multiple paths.

Alternative Embodiments

Figure 5:
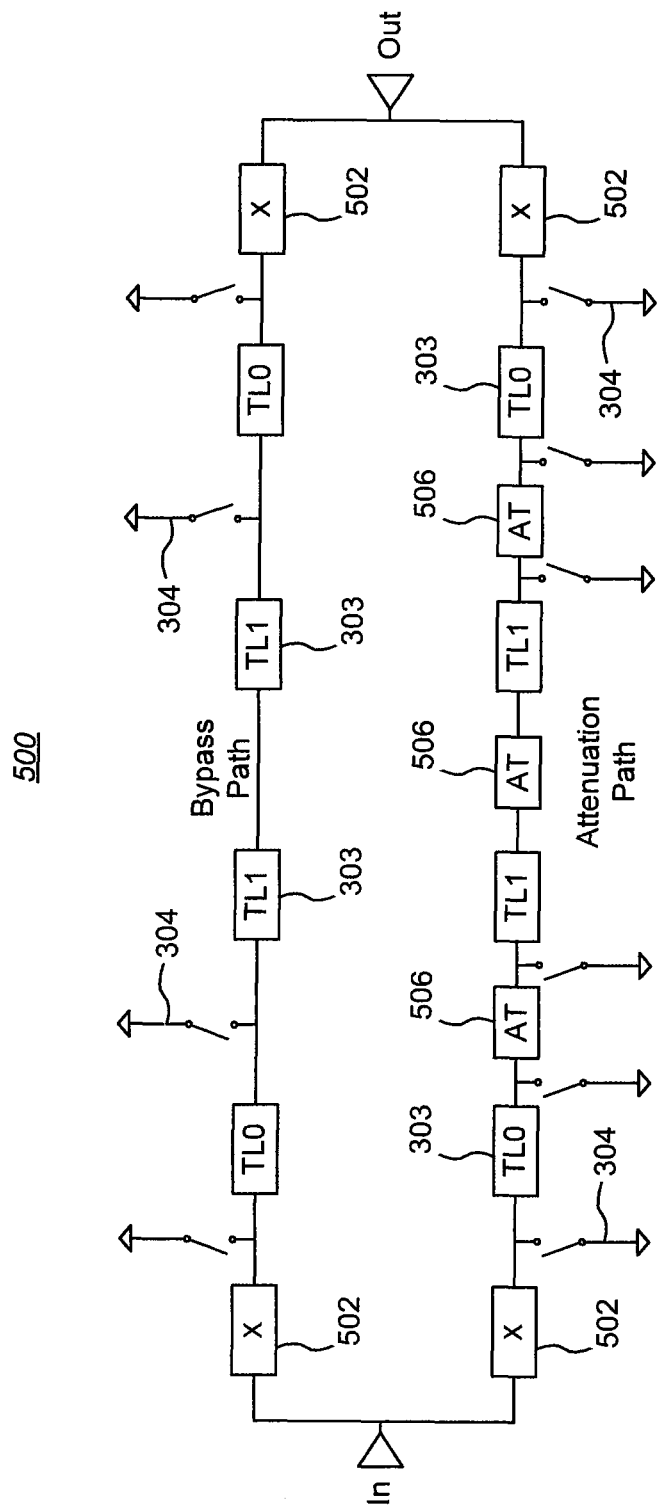
FIG. 5 is a schematic diagram of an RF attenuator circuit that is a variant of the embodiments shown in FIG. 3 and FIG. 4, showing "split" attenuator elements.

FIG. 5 is a schematic diagram of an RF attenuator circuit 500 that is a variant of the embodiments shown in FIG. 3 and FIG. 4, showing "split" attenuator elements. In this particular example, switch function blocks 502 (marked "X") indicate either state switches (302 in FIG. 3) or quarter-wave transmission line elements (402 in FIG. 4), and only two transmission line elements (TL0, TL1) 303 are shown in each signal path. When a relatively large attenuation value is desired (e.g., 16 dB), rather than have a single large-value attenuator element (e.g., block 306 in FIG. 3 and FIG. 4) in each Attenuation Path, two or more smaller-valued attenuation elements 506 may be distributed among the distributed transmission line elements TLx 303. In the illustrated embodiment, three such smaller-valued (e.g., 6 dB each) attenuation elements 506 are shown. Physically distributing attenuation elements 506 in this manner extends the circuit broad-band attenuator performance at higher frequencies. In general, RF attenuator circuit 500 configurations with two or more attenuation elements 506 should symmetrically arrange the attenuation elements 506 within the plurality of distributed transmission line elements TLx 303 so as to distribute parasitic influences and improve isolation.

In both embodiments shown in FIG. 3 and FIG. 4, the shunt switches 304 may be implemented as a "stack" of two or more series-connected FETs designed to withstand with the expected input power of an applied signal. Similarly, if needed, the shunt resistors within an attenuator element 306 may be implemented as a FET stack.

Other circuit elements, such as inductors or capacitors, may be added for particular applications for impedance matching or band tuning purposes. For example, tuning inductors may be added between the shunt switches 304 and circuit ground, and between the shunt resistors of an attenuator element 306 and circuit ground.

Figure 1A:
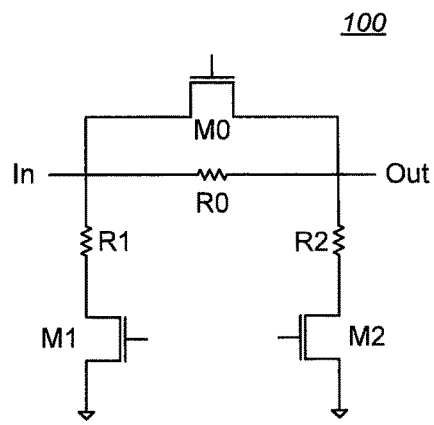
FIG. 1a is a schematic diagram of one embodiment of a conventional switchable pi-type RF attenuator.
Figure 1B:
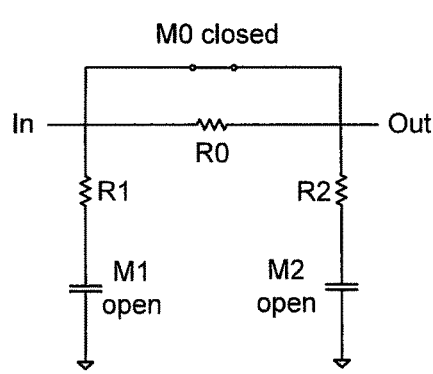
FIG. 1b is a diagram of a circuit model of the pi-type RF attenuator of FIG. 1a in a reference state, with switch M0 closed and switches M1 and M2 open.
Figure 1C:
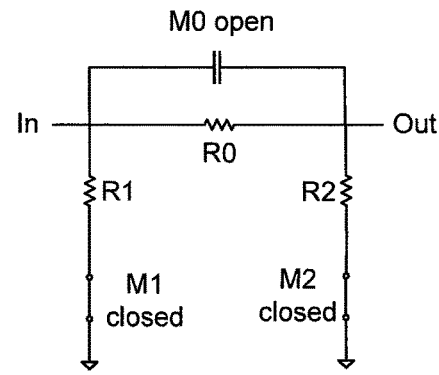
FIG. 1c is a diagram of a circuit model of the pi-type RF attenuator of FIG. 1a in an attenuation state, with switch M0 open and switches M1 and M2 closed.
Figure 2:
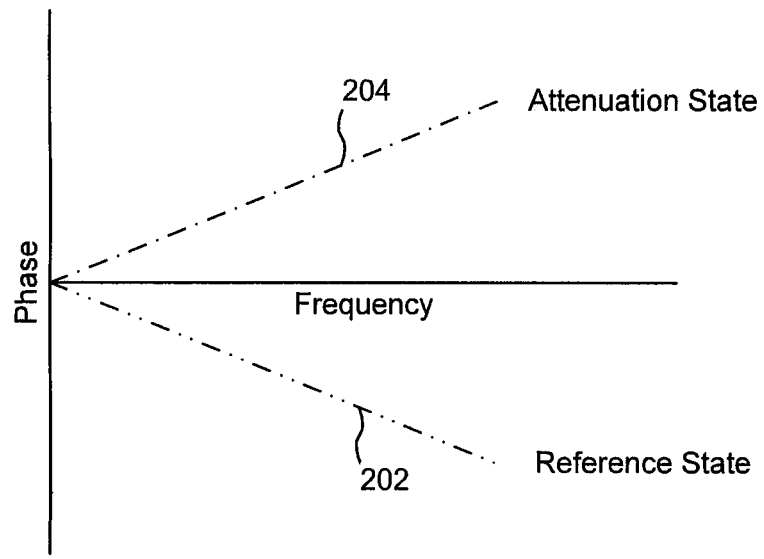
FIG. 2 is a graph showing an approximation of phase as a function of frequency for the reference state and the attenuation state of the pi-type RF attenuator of FIG. 1a when an RF signal is applied.
Figure 6:
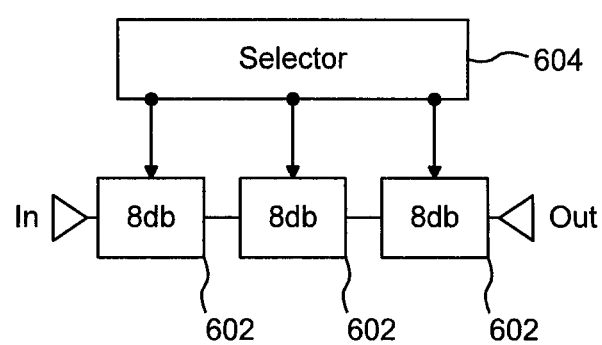
FIG. 6 is a block diagram of an example digital step attenuator (DSA) circuit comprising a set of three series-connected 8 dB RF attenuator circuits in accordance with the present invention.

To achieve higher total attenuation, or to allow programmatic selection of attenuation levels in a system (e.g., a digital step attenuator), two or more RF attenuator circuits 300, 400 of the types shown in FIG. 3 and FIG. 4 can be serially connected. FIG. 6 is a block diagram of an example digital step attenuator (DSA) circuit 600 comprising a set of three series-connected 8 dB RF attenuator circuits 602 in accordance with the present invention. Each RF attenuator circuit 602 is coupled to a selector circuit 604 that provides switching signals that can enable or disable (since each RF attenuator circuit 602 includes a Bypass Path) any or all of the RF attenuator circuits 602. Accordingly, the illustrated DSA circuit 600 can be programmed to present 0 dB, 8 dB, 16 dB, or 24dB of total attenuation (note that while 16 dB of attenuation can be achieved by enabling any two of the RF attenuator circuits 602, it may be useful to enable the two most physically distance "end" units in order to minimize cross-effects each may have on the other).

The selector circuit 604 may in turn by controlled by other internal circuit (e.g., to respond to a detected internal characteristic, such as signal power, current, or amplitude), or from external circuitry (e.g., a user control setting for a desired level of attenuation). Examples of such selector circuits 604 are known in the art (not shown in FIG. 6 in either case).

Circuit simulations of various embodiments of the invention show excellent phase characteristics at high levels of attenuation (e.g., about 6 dB-16 dB) at high RF frequencies. For example, one RF attenuator circuit 300 of the type shown in FIG. 3 has exhibited variations in attenuation of ±0.5 dB and in phase shift of <5° for frequencies below about 50 GHz. As another example, one RF attenuator circuit 400 of the type shown in FIG. 4 has exhibited variations in attenuation of ±0.5 dB and in phase shift of <5° for frequencies from about 40 GHz to about 60 GHz.

Methods

Another aspect of the invention includes a method for attenuating a radio frequency, including:
  providing a circuit with an In port and an Out port;
  providing a bypass path including a plurality of serially-connected distributed transmission line elements, a plurality of shunt switches coupled between a respective one of the plurality of distributed transmission line elements and a reference voltage, and first and second switching elements respectively coupled between the plurality of distributed transmission line elements and the In and Out ports; and
  providing at least one attenuation path, each such attenuation path including a plurality of serially-connected distributed transmission line elements, a plurality of shunt switches coupled between a respective one of the plurality of distributed transmission line elements and a reference voltage, an attenuator element serially connected to the plurality of distributed transmission line elements, and first and second switching elements respectively coupled between the plurality of distributed transmission line elements and the In and Out ports.

The above method further includes having switching elements that are state switches, and having switching elements that are quarter-wave transmission line elements.

Fabrication

Embodiments of the attenuators described above may be fabricated as a monolithic or hybrid circuit. However, there are numerous advantages to embodying the circuit concepts described above in complementary metal-oxide-semiconductor (CMOS) integrated circuits (ICs) using stacked FET switches fabricated with a silicon-on-insulator (SOI) process (which includes silicon-on-sapphire, or SOS). In particular, stacked FET switches provide an improvement in the linearity of the circuit by allowing each switch to operate in a less stressed, and therefore more linear, region. Fabrication in CMOS on SOI or SOS also enables low power consumption, the ability to withstand high power signals during operation due to FET stacking, good linearity, and high frequency operation (in excess of 10 GHz, and particularly above about 20 GHz). Monolithic IC implementation is particularly useful since parasitic capacitances generally can be kept low by careful design.

Further, as should be readily apparent to one of ordinary skill in the art, various embodiments of the invention can be implemented to meet a wide variety of specifications. Thus, selection of suitable component values are a matter of design choice unless otherwise noted above. Various embodiments of the invention may be implemented in any suitable IC technology (including but not limited to MOSFET and IFGET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or volt-age and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components to handle greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A radio frequency attenuator circuit including:
   (a) an In port and an Out port;
   (b) at least two attenuation paths, with at least one attenuation path including one or more distributed transmission line elements, one or more shunt switches each coupled between a respective one of the distributed transmission line elements and a reference voltage, at least one attenuator element serially connected to at least one distributed transmission line element, and associated first and second state switches respectively coupled between the corresponding attenuation path and the In and Out ports.

2. The radio frequency attenuator circuit of claim 1, wherein at least one shunt switch comprises one or more serially-connected field effect transistors.

3. The radio frequency attenuator circuit of claim 1, wherein at least one attenuation path includes a plurality of serially-connected distributed transmission line elements, and at least one of the attenuator elements of such attenuation path is centrally located within such plurality of distributed transmission line elements.

4. The radio frequency attenuator circuit of claim 1, wherein at least one attenuator element is one of a pi-type attenuator, a T-type attenuator, a bridged-T type attenuator, or an L-pad type attenuator.

5. The radio frequency attenuator circuit of claim 1, wherein at least one distributed transmission line element comprises an inductor.

6. The radio frequency attenuator circuit of claim 1, wherein the first and second state switches are field effect transistors.

7. The radio frequency attenuator circuit of claim 1, further including at least one tuning inductor, each coupled between a respective one of the shunt switches and the reference voltage.

8. The radio frequency attenuator circuit of claim 1, wherein at least one attenuator element includes a shunt resistor, and further including at least one tuning inductor coupled between such shunt resistor and the reference voltage.

9. The radio frequency attenuator circuit of claim 1, wherein the total impedance of at least two attenuation paths, when concurrently coupled to the In and Out ports, is configured to match a selected impedance.

10. The radio frequency attenuator circuit of claim 1, further including a bypass path including one or more distributed transmission line elements, one or more shunt switches each coupled between a respective one of the distributed transmission line elements and a reference voltage, and associated first and second state switches respectively coupled between the corresponding attenuation path and the In and Out ports.

11. A radio frequency attenuator circuit including:
    (a) an In port and an Out port;
    (b) at least two attenuation paths, each attenuation path including:
        (1) a first state switch coupled to the In port;
        (2) a second state switch coupled to the Out port;
        (3) at least one attenuator element;
        (4) at least one distributed transmission line element serially-coupled between the first state switch and the at least one attenuator element;
        (5) at least one distributed transmission line element serially-coupled between the second state switch and the at least one attenuator element; and
        (6) a plurality of shunt switches, each coupled between a respective one of the distributed transmission line elements and a reference voltage.

12. The radio frequency attenuator circuit of claim 11, wherein one or more of the plurality of shunt switches comprises one or more serially-connected field effect transistors.

13. The radio frequency attenuator circuit of claim 11, wherein at least one of the attenuator elements is centrally located within the plurality of distributed transmission line elements.

14. The radio frequency attenuator circuit of claim 11, wherein at least one of the attenuator elements is one of a pi-type attenuator, a T-type attenuator, a bridged-T type attenuator, or an L-pad type attenuator.

15. The radio frequency attenuator circuit of claim 11, wherein at least one distributed transmission line element comprises an inductor.

16. The radio frequency attenuator circuit of claim 11, wherein the first and second state switches are field effect transistors.

17. The radio frequency attenuator circuit of claim 11, further including at least one tuning inductor, each coupled between a respective one of the plurality of shunt switches and the reference voltage.

18. The radio frequency attenuator circuit of claim 11, wherein at least one attenuator element includes a shunt resistor, and further including at least one tuning inductor coupled between such shunt resistor and the reference voltage.

19. The radio frequency attenuator circuit of claim 11, wherein the total impedance of at least two attenuation paths, when concurrently coupled to the In and Out ports, is configured to match a selected impedance.

20. The radio frequency attenuator circuit of claim 11, further including a bypass path including:
    (a) a first state switch coupled to the In port;
    (b) a second state switch coupled to the Out port;
    (c) a plurality of distributed transmission line elements serially-coupled between the first and second state switches; and
    (d) a plurality of shunt switches each coupled between a respective one of the plurality of distributed transmission line elements and a reference voltage.

21. A radio frequency attenuator circuit including:
    (a) an In port and an Out port;
    (b) at least two attenuation paths, each attenuation path including a plurality of serially-connected distributed transmission line elements, a plurality of shunt switches each coupled between a respective one of the plurality of distributed transmission line elements and a reference voltage, at least one attenuator element serially connected to the plurality of distributed transmission line elements, and first and second quarter-wave transmission line elements respectively coupled between the plurality of distributed transmission line elements and the In and Out ports.

22. The radio frequency attenuator circuit of claim 21, wherein one or more of the plurality of shunt switches comprises one or more serially-connected field effect transistors.

23. The radio frequency attenuator circuit of claim 21, wherein at least one of the attenuator elements is centrally located within the plurality of distributed transmission line elements.

24. The radio frequency attenuator circuit of claim 21, wherein at least one of the attenuator elements is one of a pi-type attenuator, a T-type attenuator, a bridged-T type attenuator, or an L-pad type attenuator.

25. The radio frequency attenuator circuit of claim 21, wherein at least one distributed transmission line element comprises an inductor.

26. The radio frequency attenuator circuit of claim 21, further including at least one tuning inductor, each coupled between a respective one of the plurality of shunt switches and the reference voltage.

27. The radio frequency attenuator circuit of claim 21, wherein at least one attenuator element includes a shunt resistor, and further including at least one tuning inductor coupled between such shunt resistor and the reference voltage.

28. The radio frequency attenuator circuit of claim 21, wherein the total impedance of at least two attenuation paths, when concurrently coupled to the In and Out ports, is configured to match a selected impedance.

29. The radio frequency attenuator circuit of claim 21, further including a bypass path including a plurality of serially-connected distributed transmission line elements, a plurality of shunt switches each coupled between a respective one of the plurality of distributed transmission line elements and a reference voltage, and first and second quarter-wave transmission line elements respectively coupled between the plurality of distributed transmission line elements and the In and Out ports.

30. A radio frequency attenuator circuit including:
   (a) an In port and an Out port;
   (b) at least two attenuation paths, each attenuation path including:
      (1) a first quarter-wave transmission line element coupled to the In port;
      (2) a second quarter-wave transmission line element coupled to the Out port;
      (3) at least one attenuator element;
      (4) at least one distributed transmission line element serially-coupled between the first quarter-wave transmission line element and the at least one attenuator element;
      (5) at least one distributed transmission line element serially-coupled between the second quarter-wave transmission line element and the at least one attenuator element; and
      (6) a plurality of shunt switches each coupled between a respective one of the plurality of distributed transmission line elements and a reference voltage.

31. The radio frequency attenuator circuit of claim 30, wherein one or more of the plurality of shunt switches comprises one or more serially-connected field effect transistors.

32. The radio frequency attenuator circuit of claim 30, wherein at least one of the attenuator elements is centrally located within the plurality of distributed transmission line elements.

33. The radio frequency attenuator circuit of claim 30, wherein at least one of the attenuator elements is one of a pi-type attenuator, a T-type attenuator, a bridged-T type attenuator, or an L-pad type attenuator.

34. The radio frequency attenuator circuit of claim 30, wherein at least one distributed transmission line element comprises an inductor.

35. The radio frequency attenuator circuit of claim 30, further including at least one tuning inductor, each coupled between a respective one of the plurality of shunt switches and the reference voltage.

36. The radio frequency attenuator circuit of claim 30, wherein at least one attenuator element includes a shunt resistor, and further including at least one tuning inductor coupled between such shunt resistor and the reference voltage.

37. The radio frequency attenuator circuit of claim 30, wherein the total impedance of at least two attenuation paths, when concurrently coupled to the In and Out ports, is configured to match a selected impedance.

38. The radio frequency attenuator circuit of claim 30, further including a bypass path including:
   (a) a first quarter-wave transmission line element coupled to the In port;
   (b) a second quarter-wave transmission line element coupled to the Out port;
   (c) a plurality of distributed transmission line elements serially-connected between the first and second quarter-wave transmission line elements; and
   (d) a plurality of shunt switches each coupled between a respective one of the plurality of distributed transmission line elements and a reference voltage.

39. A digital step attenuator for selectably attenuating a radio frequency, including:
   (a) at least two serially-connected radio frequency attenuator circuits as set forth in claim 1, 11, 21, or 30; and
   (b) a selector circuit coupled to each of the at least two serially-connected radio frequency attenuator circuits for selectably enabling or disabling one or more of the at least two serially-connected radio frequency attenuator circuits.

* * * * *